(12) United States Patent
Griggs

(10) Patent No.: US 9,306,499 B2
(45) Date of Patent: Apr. 5, 2016

(54) TRAVELING WAVE MIXER, SAMPLER, AND SYNTHETIC SAMPLER

(71) Applicant: AGILENT TECHNOLOGIES, INC., Loveland, CO (US)

(72) Inventor: Keith C. Griggs, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 235 days.

(21) Appl. No.: 14/040,404

(22) Filed: Sep. 27, 2013

(65) Prior Publication Data

US 2015/0091632 A1 Apr. 2, 2015

(51) Int. Cl.
*H03F 3/19* (2006.01)
*H03D 7/14* (2006.01)
*H03F 3/191* (2006.01)
*H03F 3/60* (2006.01)

(52) U.S. Cl.
CPC ........... *H03D 7/1433* (2013.01); *H03D 7/1458* (2013.01); *H03F 3/191* (2013.01); *H03F 3/605* (2013.01); *H03F 2200/255* (2013.01)

(58) Field of Classification Search
None
See application file for complete search history.

(56) References Cited

U.S. PATENT DOCUMENTS

| | | | |
|---|---|---|---|
| 4,992,752 A * | 2/1991 | Cioffi | 330/54 |
| 4,994,755 A * | 2/1991 | Titus et al. | 330/54 |
| 5,654,670 A | 8/1997 | Lange | |
| 5,689,210 A | 11/1997 | Lange | |
| 6,094,099 A * | 7/2000 | Kobayashi | 330/254 |
| 6,433,640 B1 * | 8/2002 | Pavio et al. | 330/295 |
| 6,597,243 B1 * | 7/2003 | Fratti | 330/54 |
| 6,650,185 B1 * | 11/2003 | Stengel et al. | 330/286 |
| 6,930,557 B2 * | 8/2005 | Shigematsu | 330/295 |
| 7,279,980 B2 * | 10/2007 | Heydari et al. | 330/286 |
| 7,792,513 B2 * | 9/2010 | Safarian et al. | 455/296 |
| 8,351,891 B2 | 1/2013 | Heydari et al. | |
| 8,907,722 B2 * | 12/2014 | Tatsumi et al. | 330/54 |
| 9,024,703 B2 * | 5/2015 | Ferndahl et al. | 333/125 |
| 2006/0172718 A1 * | 8/2006 | Leistner et al. | 455/323 |
| 2012/0075034 A1 * | 3/2012 | Afshari et al. | 333/101 |

OTHER PUBLICATIONS

Co-pending U.S. Appl. No. 13/097,882, filed Apr. 29, 2011.
Zare, et al. "Preamplifier Effect on the Performance of Distributed Active Mixer", Proceedings 2010 IEEE Asia Pacific Conference on Circuits and Systems (APCCAS 2010), 600-3, 2010.

* cited by examiner

*Primary Examiner* — Thomas J Hiltunen

(57) ABSTRACT

An electronic device comprises an input transmission line that receives an input signal, an output transmission line that transmits an output signal, a local oscillator transmission line that transmits a local oscillator signal, multiple amplification and mixing stages arranged in parallel between the input and output transmission lines and each amplifying a received portion of the input signal and mixing the amplified portion of the input signal with the local oscillator signal to produce a portion of the output signal, and multiple amplification stages arranged in parallel between the input and output transmission lines and each amplifying a received portion of the input signal to produce a portion of the output signal. The amplification stages are located proximate an output side of the electronic device, and the amplification and mixing stages are located proximate an input side of the electronic device.

28 Claims, 12 Drawing Sheets

TRAVELING WAVE MIXER, SAMPLER, AND SYNTHETIC SAMPLER

BACKGROUND

Mixers and samplers can be found in most high frequency communication systems. For example, mixers are commonly used to shift signals from one frequency range to another for convenience or compatibility in transmission or signal processing. Samplers, on the other hand, are generally used to convert continuous signals into discrete signals for signal processing.

The performance of a mixer or sampler can be evaluated according to parameters such as bandwidth, noise, and gain, among others. As information rates go up, the bandwidths of the underlying components like mixers and samplers must also increase. Similarly, adequate noise and/or gain values are required to maintain quality of the processed information. Each of these parameters is important for most modern systems, as developers are continually pushing the envelope of processing speed and quality.

In high frequency mixers and samplers, bandwidth, noise and gain are sensitive to intrinsic device characteristics and parasitics. In addition there are tradeoffs to be made between these parameters. It is difficult in general to improve one without sacrificing the other two. One technique for optimizing these parameters is by distributing the devices along a transmission line. A basic implementation of this technique can be found in a travelling wave amplifier.

In addition as a consequence of this strong sensitivity to device parasitics, high frequency mixers and samplers are commonly implemented with specialized devices or processes that minimize or reduce parasitics. For example, some mixers or samplers may be implemented with pseudomorphic high electron mobility transistors (pHEMT), which tend to have relatively low parasitic C. Similarly, some mixers may be manufactured by forming a mixer bridge with specialized processes typically used to manufacture tow capacitance diodes.

Unfortunately, these specialized devices and processes are generally expensive and inefficient to manufacture. Consequently, there is a general need for improved designs for high performance mixers and samplers.

SUMMARY

In a representative embodiment, an electronic device comprises an input transmission line configured to receive an input signal, an output transmission line configured to transmit an output signal produced according to the input signal, a local oscillator transmission line configured to transmit a local oscillator signal, a plurality of amplification and mixing stages arranged in parallel between the input and output transmission lines and each configured to amplify a received portion of the input signal and mix the amplified portion of the input signal with the local oscillator signal to produce a portion of the output signal, and a plurality of amplification stages arranged in parallel between the input and output transmission lines and each configured to amplify a received portion of the input signal to produce a portion of the output signal, wherein the plurality of amplification stages are located proximate an output side of the electronic device that transmits the output signal, and the plurality of amplification and mixing stages are located proximate an input side of the electronic device that receives the input signal.

In certain related embodiments, the electronic device further comprises an additional output transmission line configured to transmit an additional output signal produced according to the input signal, wherein the output signal corresponds to even samples of a synthetic sampler and the additional output signal corresponds to odd samples of a synthetic sampler, an additional plurality of amplification and mixing stages arranged in parallel between the input transmission line and the additional output transmission line and each configured to amplify a received portion of the input signal and mix the amplified portion of the input signal with the local oscillator signal to produce a portion of the additional output signal, and an additional plurality of amplification stages arranged in parallel between the input transmission line and the additional output transmission line and each configured to amplify a received portion of the input signal to produce a portion of the additional output signal, wherein the additional plurality of amplification stages are located proximate the output side of the electronic device that transmits the output signal, and the additional plurality of amplification and mixing stages are located proximate the input side of the electronic device that receives the input signal.

In certain related embodiments, the electronic device further comprises one or more first transmission line elements each disposed along the input transmission line between a corresponding pair of the amplification and mixing stages, one or more second transmission line elements each disposed along the output transmission line between a corresponding pair of the amplification and mixing stages, and one or more third transmission line elements each disposed along the local oscillator transmission line between a corresponding pair of the amplification and mixing stages. Each of the first through third transmission line elements may comprise a circuit trace, for example. Moreover, the electronic device may further comprise one or more first transmission line elements each disposed along the input transmission line between a corresponding pair of the amplification stages, and one or more second transmission line elements each disposed along the second transmission line between a corresponding pair of the amplification stages.

In another representative embodiment, an electronic device comprises an input transmission line configured to receive an input signal, an output transmission line configured to transmit an output signal produced according to the input signal, a sample clock transmission line configured to transmit a sample clock signal, and a plurality of amplification and sampling stages arranged in parallel between the input and output transmission lines and each configured to amplify a received portion of the input signal and sample the amplified portion of the input signal using the sample clock signal to produce a portion of the output signal.

In certain related embodiments, the electronic device further comprises an additional output transmission line configured to transmit an additional output signal produced according to the input signal, wherein the output signal corresponds to even samples of the input signal and the additional output signal corresponds to odd samples of the input signal.

BRET DESCRIPTION OF THE DRAWINGS

The described embodiments are best understood from the following detailed description when read with the accompanying drawing figures. Wherever applicable and practical, like reference numerals refer to like elements.

DETAILED DESCRIPTION

Figure 1:
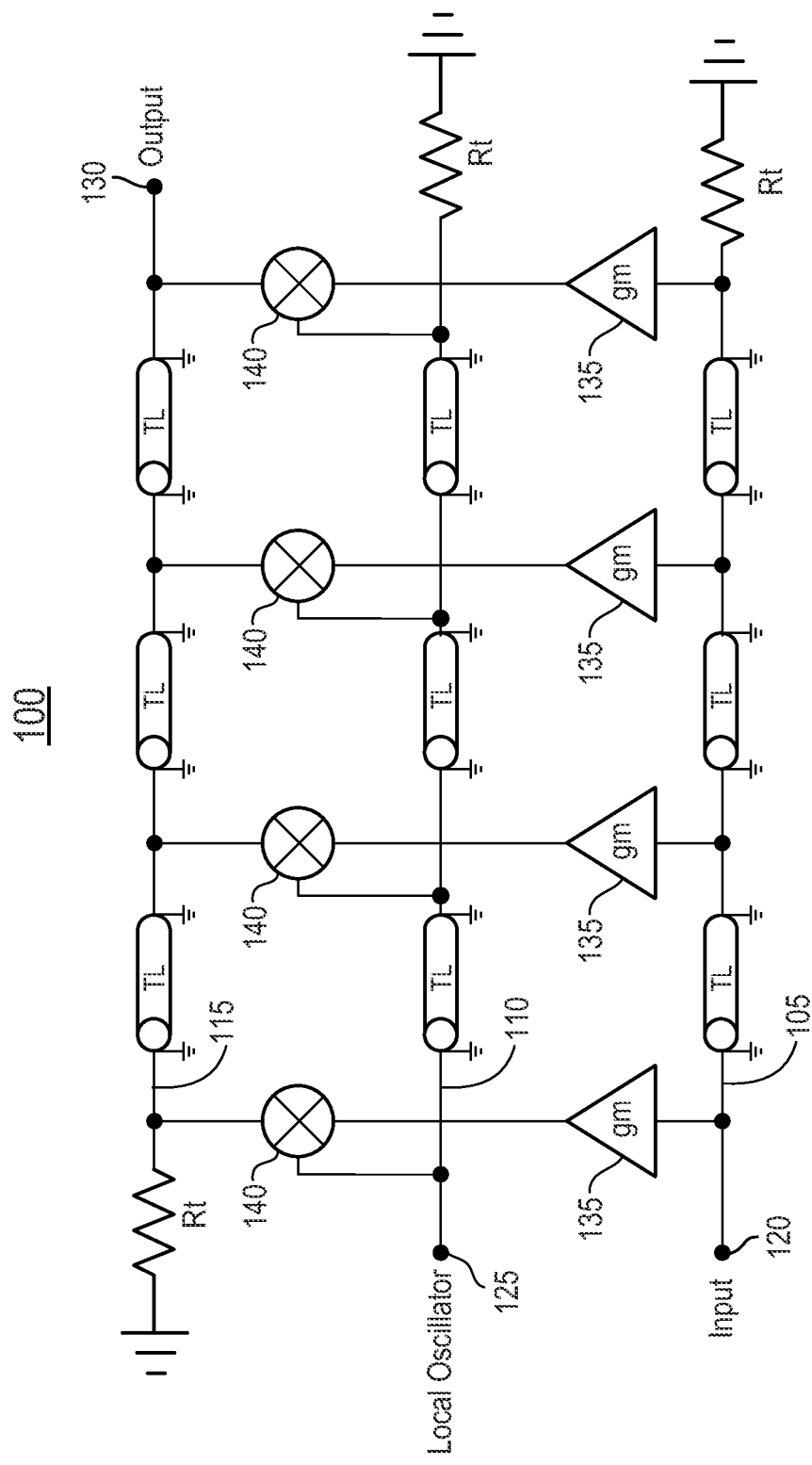
FIG. 1 is a circuit diagram illustrating a traveling wave mixer, in accordance with a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. As used in the specification and appended claims, the terms 'a', 'an' and 'the' include both singular and plural referents, unless the context clearly dictates otherwise. Thus, for example, 'a device' includes one device and plural devices.

The described embodiments relate generally to traveling wave mixers, samplers, and synthetic samplers. These devices can be implemented by arranging various components in parallel between an input transmission line and an output transmission line such that their functional properties (e.g., transconductance) are added linearly white parasitic properties, such as inductance and capacitance, are distributed along the transmission lines rather than lumped together at a single input or output point. For example, in a traveling wave mixer according to various embodiments, a plurality of A/M stages are arranged in parallel between the input and output transmission lines, and a separate LO transmission line is connected to each of the A/M stages to provide an LO signal to be mixed with an input signal provided through the input transmission line.

The described embodiments may provide various benefits compared to mixers and samplers formed of a single stage. For instance, the use of multiple stages to distribute parasitic properties along the transmission tines can increase the gain-bandwidth product and/or signal to noise ratio (SNR) for a particular bandwidth. It can also provide higher SNR and drive than a single stage amplifier and mixer for the same bandwidth. Moreover, it may make it easier to split an output signal to drive separate circuits, and it may allow for combination of mixers and amplifier stages with relatively precise time alignment. The above and other benefits may allow relatively high frequency (e.g., at a rate of 100 GHz or more) mixers or samplers to be manufactured using standard high frequency processes (e.g., silicon germanium (SiGe) and indium phosphide (InP)) instead of specialized pHEMT processes or specialized process used to manufacture low capacitance diodes.

The described embodiments find ready application in various contexts in which high frequency signals are processed, such as computing systems, communication systems, and test and measurement systems, to name but a few. For example, a test instrument for RF devices may comprise a traveling wave mixer, sampler, or synthetic sampler as described below.

FIG. 1 is a circuit diagram illustrating a traveling wave mixer 100, in accordance with a representative embodiment. Like other mixers, traveling wave mixer 100 receives an input signal and an LO signal, and it produces a product of the input signal and the signal in the time domain. The input signal is typically a radio frequency (RF) signal, and the LO generally includes frequencies determined by a difference between frequencies of the input signal and the LO signal.

Referring to FIG. 1, traveling wave mixer 100 comprises a first transmission line 105 ("input transmission line"), a second transmission line 115 ("Output transmission line"), a plurality of A/M stages arranged in parallel between first and second transmission lines 105 and 115, and a third transmission line 110 ("LO transmission line"). The first through third transmission lines each comprise a plurality of transmission line elements, labeled "TL". Each of the transmission line elements comprises a smaller transmission line and has a characteristic delay. Each of the A/M stages comprises a transconductance (gm) amplifier 135 arranged in series with a mixer 140.

Figure 2:
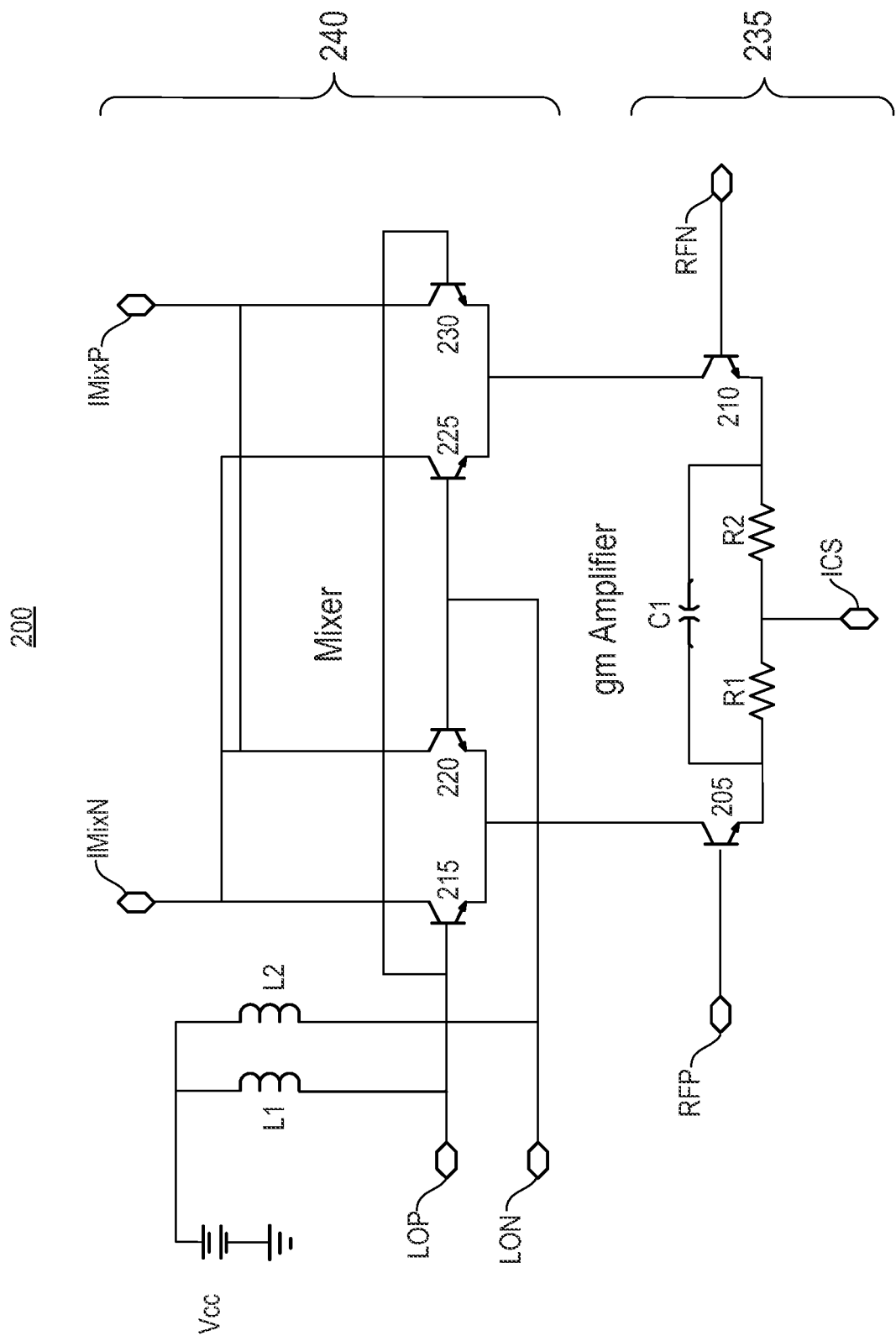
FIG. 2 is a circuit diagram illustrating an amplification and mixing (A/M) stage, in accordance with a representative embodiment.

Although drawn as single lines in FIG. 1, each of the transmission lines typically comprises a pair of conductors for differential signaling. For example, as illustrated in FIG. 2, the LO transmission line may comprise a positive signal line LOP for transmitting an LO signal with positive polarity, and a negative signal line LON for carrying the LO signal with negative polarity. Similarly, as also illustrated in FIG. 2, the input transmission line may comprise a positive RF line REP and a negative RF line RFN.

First transmission line 105 is connected between an input port 120 (or terminal) and ground via a first plurality of transmission line elements and a first terminating resistor Rt. Second transmission line 115 is connected between an output port 130 and ground via a second plurality of transmission line elements and a second terminating resistor Rt. Third transmission line 110 is connected between an LO port and ground via a third plurality of transmission line elements and a third terminating resistor Rt. The transmission line elements typically take the form of circuit traces, such as those produced by known integrated circuit (IC) manufacturing processes, and their characteristic delays are determined, at least in part, by the properties of those circuit traces. The terminating resistors are included on the respective transmission lines to minimize destructive signal reflections.

First transmission line 105 is configured to receive a first signal ("input signal" or "RF signal") through input port 120. Second transmission line 115 is configured to transmit a second signal ("output signal"), which is produced in relation to the first signal, through output port 130. Third transmission line 110 is configured to supply an LO signal to the mixer of each of the plurality of A/M stages. Gm amplifiers 135 are configured to convert voltages apparent on first transmission line 105 into currents supplied to the respective mixers 140. Mixers 140 are configured to mix the LO signal with the respective converted voltages.

During typical operation, the input signal is supplied to input port 120 of first transmission line 105. As the input signal propagates down first transmission line 105, the individual A/M stages respond by inducing an amplified and frequency translated complementary forward traveling wave on second transmission line 115. First and second transmission lines 105 and 115 are typically designed such that their transmission line elements produce substantially equal delay, which results in the respective outputs of the individual A/M stages summing in phase. The design of transmission line elements with substantially equal delays can be accomplished through proper selection of propagation constants and lengths of the two lines.

The overall gain of traveling wave mixer 100 is generally a linear function of the number of A/M stages, exhibiting an additive gain with an increasing number of stages. More specifically, traveling wave mixer 100 exhibits an additive gain with an increasing number of stages. This additive gain, coupled with the distribution of parasitics across the transmission lines, enables traveling wave mixer 100 to achieve an increased gain-bandwidth product while maintaining a desired SNR.

FIG. 2 is a circuit diagram illustrating an A/M stage 200, in accordance with representative embodiment. A/M stage 200 represents one possible implementation of an A/M stage formed by one of gm amplifiers 135 and one of mixers 140. Although the illustrated A/M stage is constructed with bipolar-junction transistors (BJTs), those skilled in the art will recognize that a functionally similar or equivalent A/M stage could be constructed with other types of transistors, such as junction gate field effect transistors (JFETs) or metal oxide semiconductor field effect transistors (MOSFETs).

Referring to FIG. 2, A/M stage 200 comprises a gm amplifier 235 and a mixer 240, A/M stage 200 receives an input RF signal through a pair of differential signal lines connected to gm amplifier 235, and it receives an LO signal through a pair of differential signal lines connected to mixer 240. A/M stage 200 receives the RE signal with positive polarity through a positive RF line RFP, and it receives the RF signal with negative polarity through a negative RF line RFN. A/M stage 200 receives the LO signal with positive polarity through a positive LO line LOP, and it receives the LO signal with negative polarity through a negative LO line LON.

Gm amplifier 235 comprises a pair of BJTs 205 and 210, each arranged in an amplifying configuration. BJT 205 receives the RF signal with positive polarity at its base, and BJT 210 receives the RF signal with negative polarity at its base. Gm amplifier 235 further comprises a pair of resistors R1 and R2 and a capacitor C1 arranged between the respective emitters of BJTs 205 and 210 and a current source ICS, as illustrated in the drawing.

Mixer 240 is a Gilbert mixer comprising two cross coupled differential pairs of transistors. In particular, it comprises a first pair of emitter-connected BJTs 215 and 220, and a second pair of emitter-connected BJTs 225 and 230. The respective emitters of the first pair are connected to the collector of BJT 205, and the respective emitters of the second pair are connected to the collector of BJT 210. The respective bases of BJTs 215 and 230 receive the LO signal with positive polarity through positive LO line LOP, and the respective bases of BJTs 220 and 225 receive the signal with negative polarity through negative LO line LON. The positive and negative LO lines LOP and LON are connected to a positive supply voltage Vcc through corresponding inductors L1 and L2.

The respective collectors of BJTs 215 and 225 are connected to a negative mixing output line IMixN, and the respective collectors of BJTs 220 and 230 are connected to a positive mixing output line IMixP. In the context of an electronic device such as that illustrated in FIG. 1, the positive and negative mixing output lines IMixP and IMixN of each A/M stage are typically connected to the output transmission line, which forms a system where the current outputs of the mixers are summed in phase.

Figure 3:
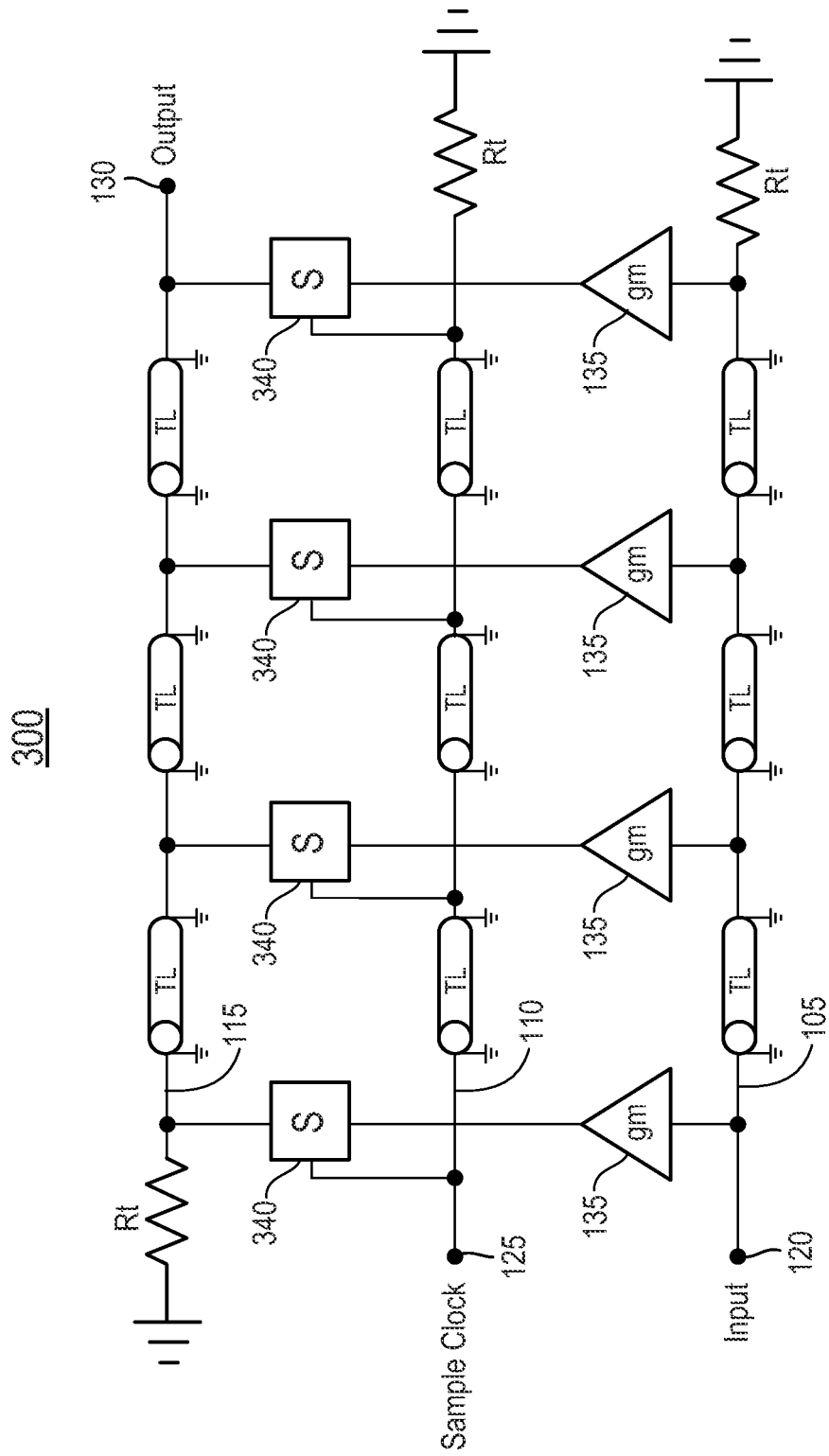
FIG. 3 is a circuit diagram illustrating a traveling wave synthetic sampler, in accordance with a representative embodiment.

FIG. 3 is a circuit diagram illustrating a traveling wave sampler 300, in accordance with a representative embodiment. Traveling wave sampler 300 is similar to traveling wave mixer 100, except that mixers 140 are replaced with samplers 340, and the LO signal is replaced with a sample clock signal. The combination of each gm amplifier 135 and a corresponding sampler 340 constitutes an amplification and sampling (A/S) stage. The operation of traveling wave sampler 300 can be understood generally by analogy with the description of FIG. 1. The operation of the A/S stages, in particular, can be understood from the description of FIG. 4 below.

Figure 4:
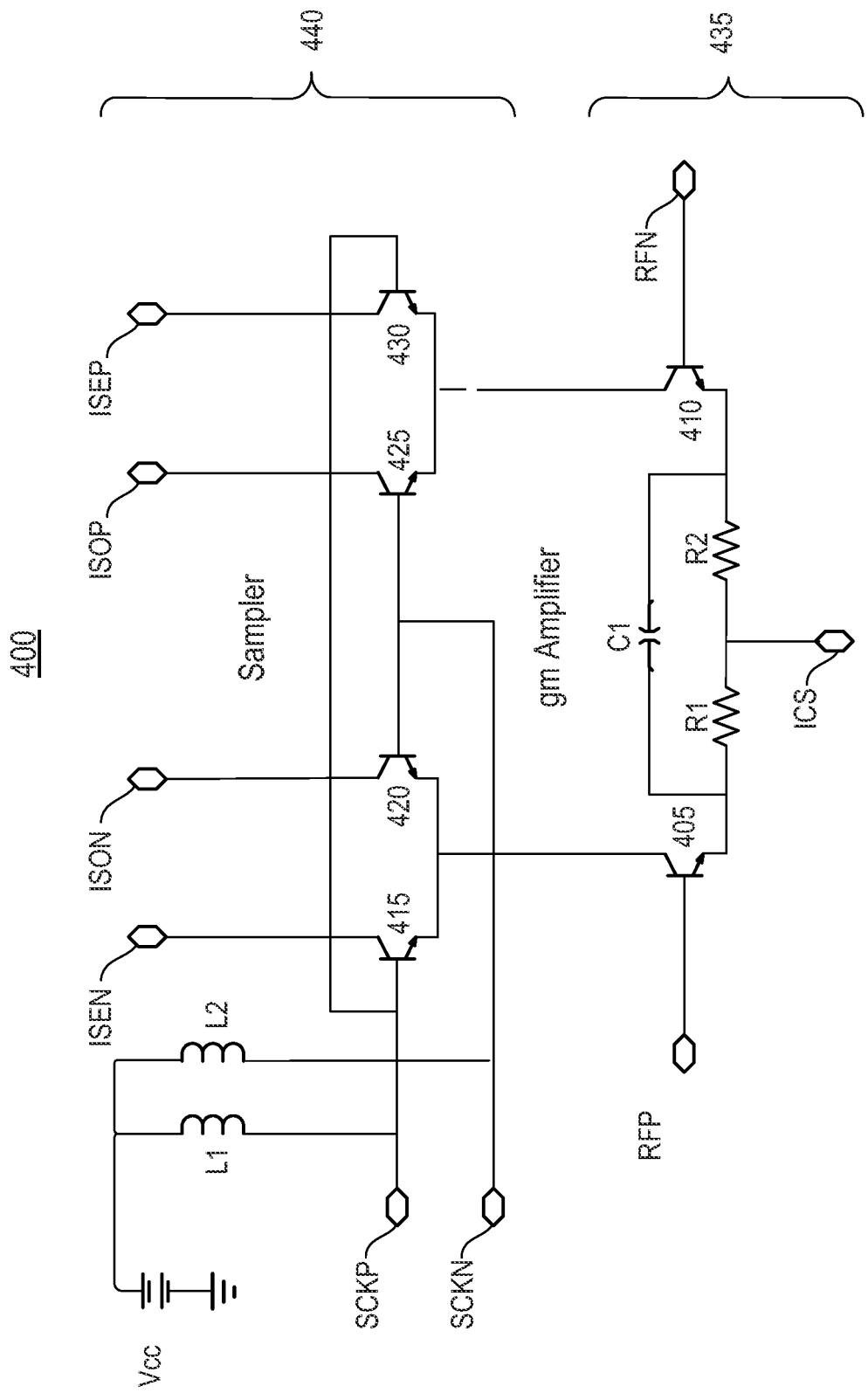
FIG. 4 is a circuit diagram illustrating an amplification and sampling (A/S) stage, in accordance with a representative embodiment.

FIG. 4 is a circuit diagram illustrating A/S stage 400, in accordance with a representative embodiment. A/S stage 400 represents one possible implementation of an A/M stage formed by one of gm amplifiers 135 and one of samplers 340.

Referring to FIG. 4, A/S stage 400 comprises a gm amplifier 435 and a sampler 440. A/S stage 400 receives an input RF signal through a pair of differential signal lines connected to gm amplifier 435, and it receives a sample clock signal through a pair of differential signal lines connected to sampler 440. A/S stage 400 receives the RF signal with positive polarity through a positive RF line RFP, and it receives the RF signal with negative polarity through a negative RF line RFN. A/S stage 400 receives the sample clock signal with positive polarity through a positive sample clock line SCKP, and it receives the sample clock signal with negative polarity through a negative sample clock line SCKN.

Gm amplifier 435 has the same structure and function as gm amplifier 235 of FIG. 2. It comprises a pair of BJTs 405 and 410, a pair of resistors R1 and R2, and a capacitor C1, arranged in the same configuration as corresponding features in FIG. 2.

Sampler 440 is similar to mixer 240, except that its outputs are not cross coupled. The collectors of each sampler output go to a separate distributed tine. This produces an odd and even sample. The resulting samples have an aperture width of approximately ½ the sample clock period. More specifically, sampler 440 comprises a first pair of emitter-connected BJTs 415 and 420, and a second pair of emitter-connected BJTs 425 and 430. The respective emitters of the first pair are connected to the collector of BJT 405, and the respective emitters of the second pair are connected to the collector of BJT 410. The respective bases of BJTs 415 and 430 receive the sample clock signal with positive polarity through positive sample clock line SCKP, and the respective bases of BJTs 420 and 425 receive the sample clock signal with negative polarity through negative sample clock line SCKN. The positive and negative sample clock lines SCKP and SCKN are connected to a positive supply voltage Vcc through corresponding inductors L1 and L2.

The respective collectors of BJTs 415 through 430 are connected to sample output lines corresponding to even and odd samples of and positive and negative polarities. More specifically, the collector of BJT 415 is connected to a negative-polarity even sample output line ISEN, the collector of BJT 420 is connected to a negative-polarity odd sample output line ISON, the collector of BJT 425 is connected to a positive-polarity odd sample output line ISOP, and the collector of BJT 430 is connected to a positive-polarity even sample output line ISEP. In the context of an electronic device such as that illustrated in FIG. 1, the output lines ISEN, ISON, ISOP, and ISEP of each A/M stage are typically connected to the output transmission line, which forms a system where the current outputs of the samplers are summed in phase.

Figure 5:
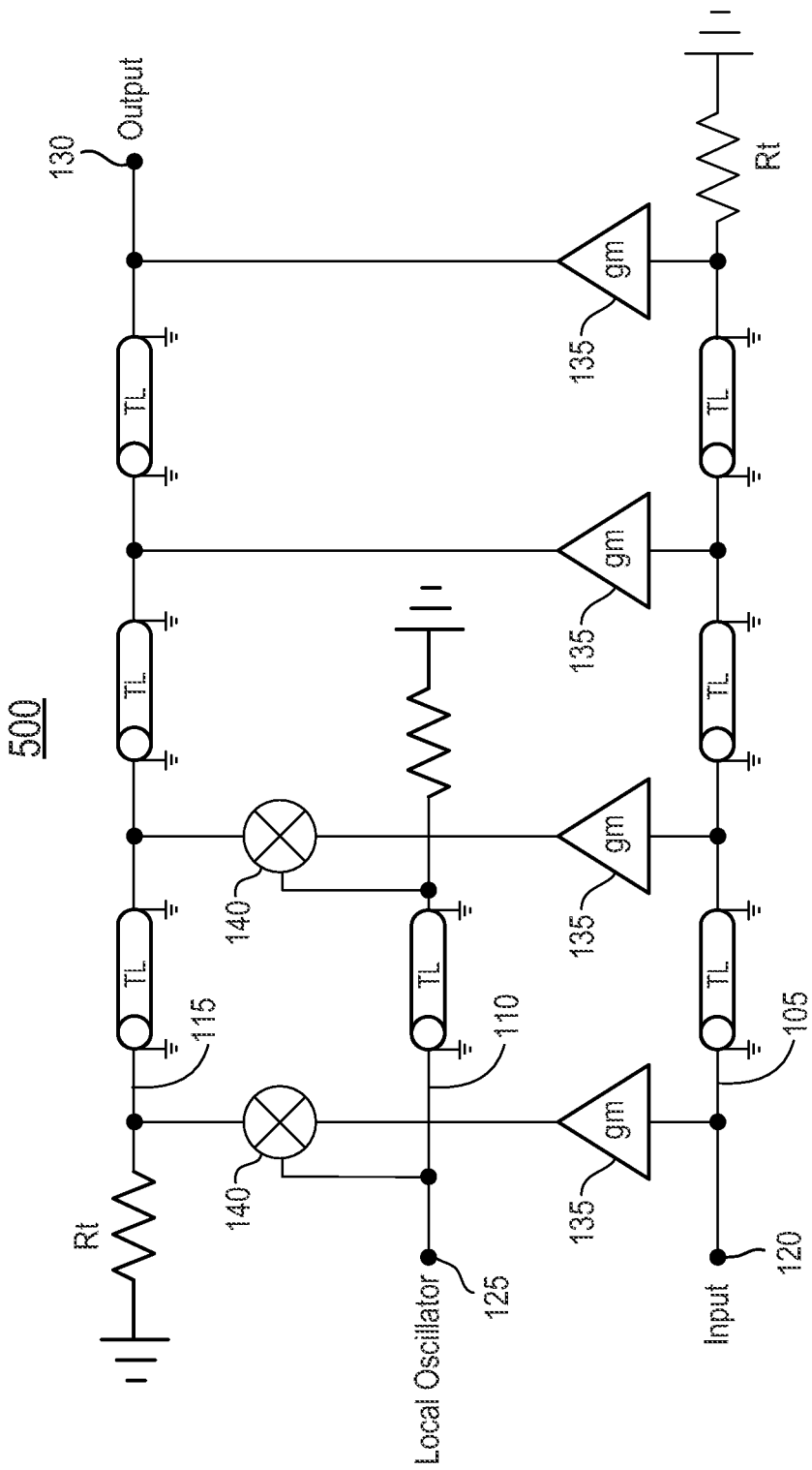
FIG. 5 is a circuit diagram illustrating a traveling wave synthetic sampler, in accordance with a representative embodiment.

FIG. 5 is a circuit diagram illustrating a traveling wave synthetic sampler 500, in accordance with a representative embodiment, and FIGS. 6A through 6G are various diagrams illustrating another traveling wave synthetic sampler 600, in accordance with a representative embodiment.

Certain principles of synthetic sampling, as well as example technologies for performing synthetic sampling are described in U.S. patent application Ser. No. 13/097,882 filed Apr. 29, 2011, the subject matter of which is hereby incorporated by reference. In general, a synthetic sampler produces samples each comprising a combination of a mixed high band signal and an amplified low band signal. An even sample is equal to the high band signal plus the low band signal and an odd sample is equal to the high band signal minus the low band signal. A traveling wave design for synthetic sampling can perform synthetic sampling in a single stage while maintaining acceptable SNR. In addition the distributed nature of the traveling wave design allows for precise combination of the mixed and unmixed components of each sample.

Relay to FIG. 5, traveling wave synthetic sampler 500 comprises the same features as traveling wave mixer 100, except that it omits two of mixers 140. The illustrated circuit produces only an even or odd sample, and additional circuitry is required to produce a corresponding odd or even sample. FIGS. 6A through 6G provide examples of such additional circuitry, as well as additional details that may be included in features shown in FIG. 5.

Figure 6A:
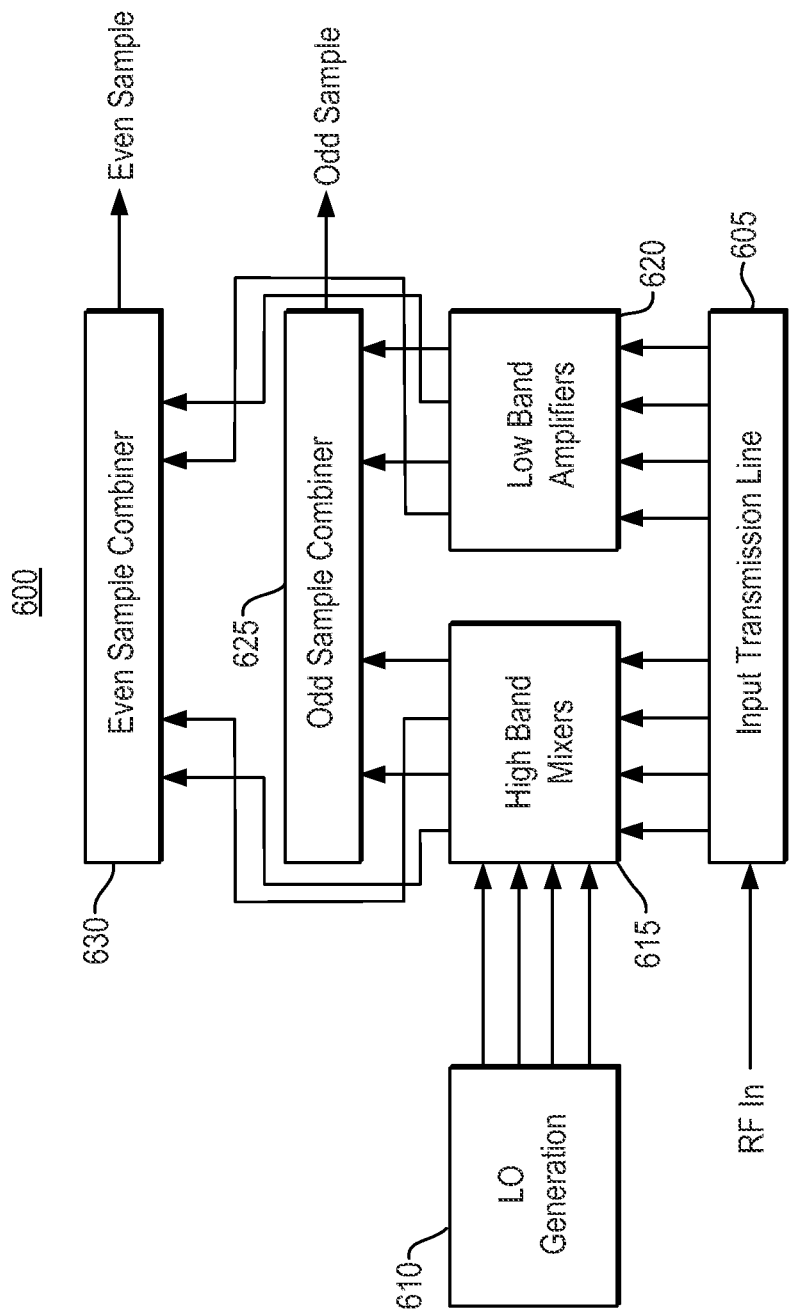
FIG. 6A is a block diagram of another traveling wave synthetic sampler, in accordance with a representative embodiment.
Figure 6B:
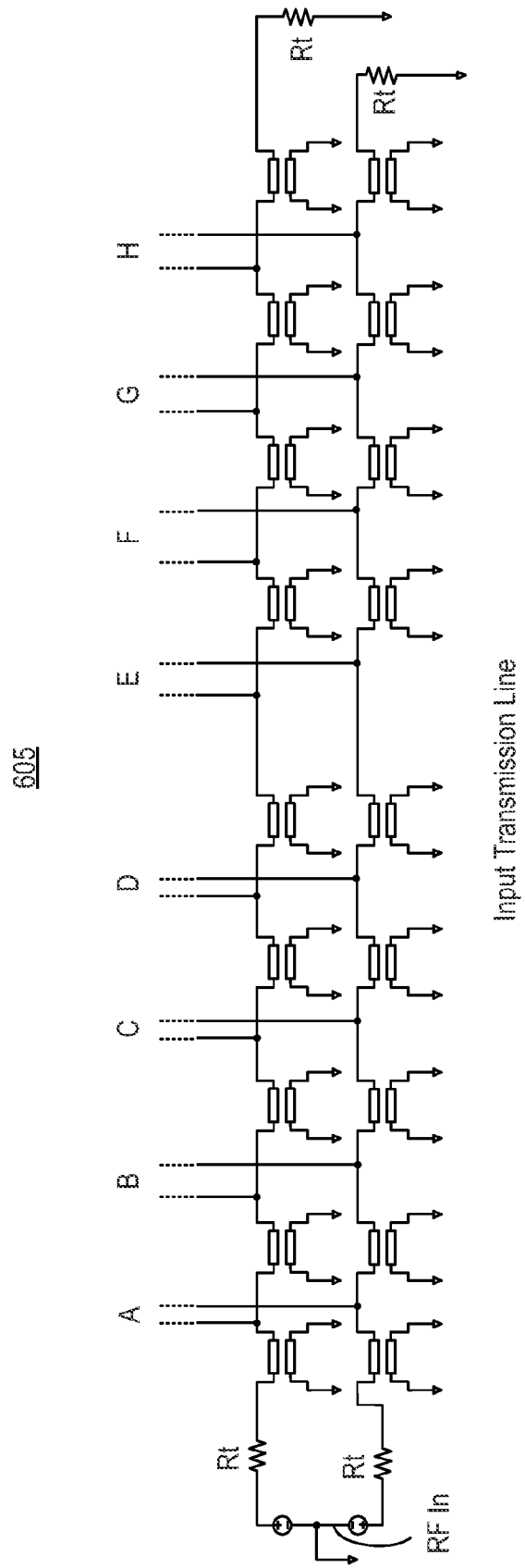
FIG. 6B is a circuit diagram of an input transmission line in the traveling wave synthetic sampler of FIG. 6A, in accordance with a representative embodiment.
Figure 6C:
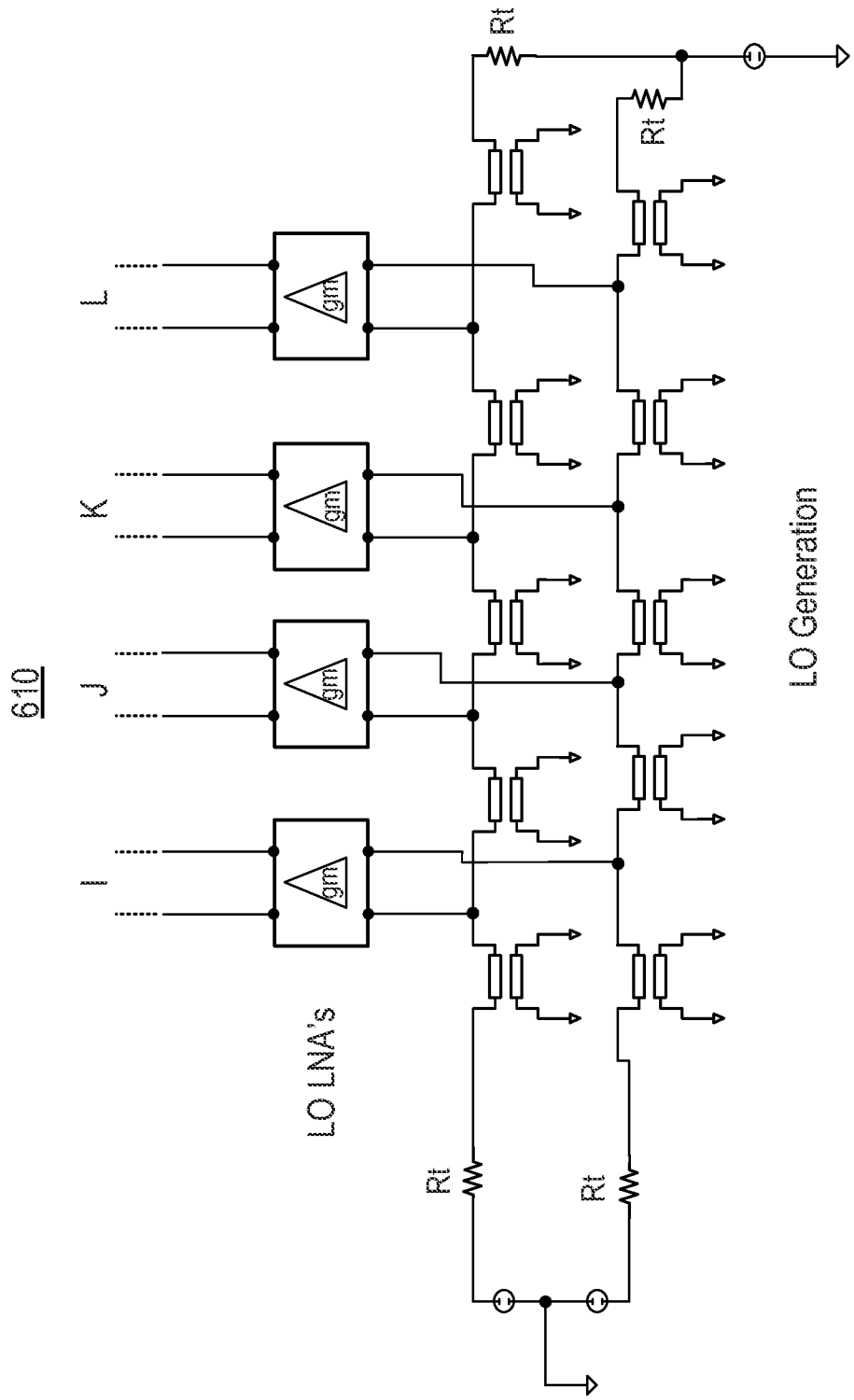
FIG. 6C is a circuit diagram of a local oscillator (LO) signal generation unit in the traveling wave synthetic sampler of FIG. 6A, in accordance with a representative embodiment.
Figure 6D:
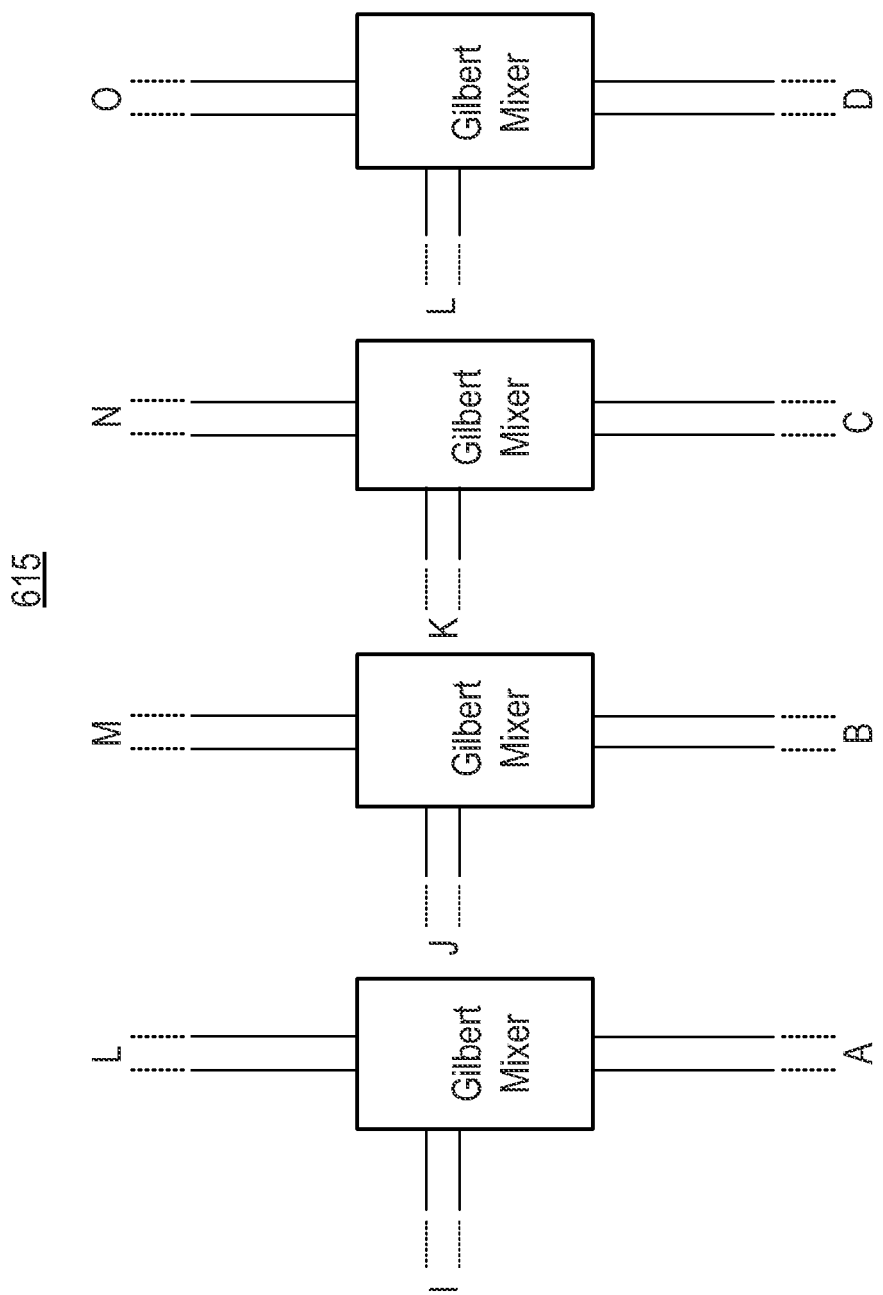
FIG. 6D is a circuit diagram of high band mixers in the traveling wave synthetic sampler of FIG. 6A, in accordance with a representative embodiment.
Figure 6E:
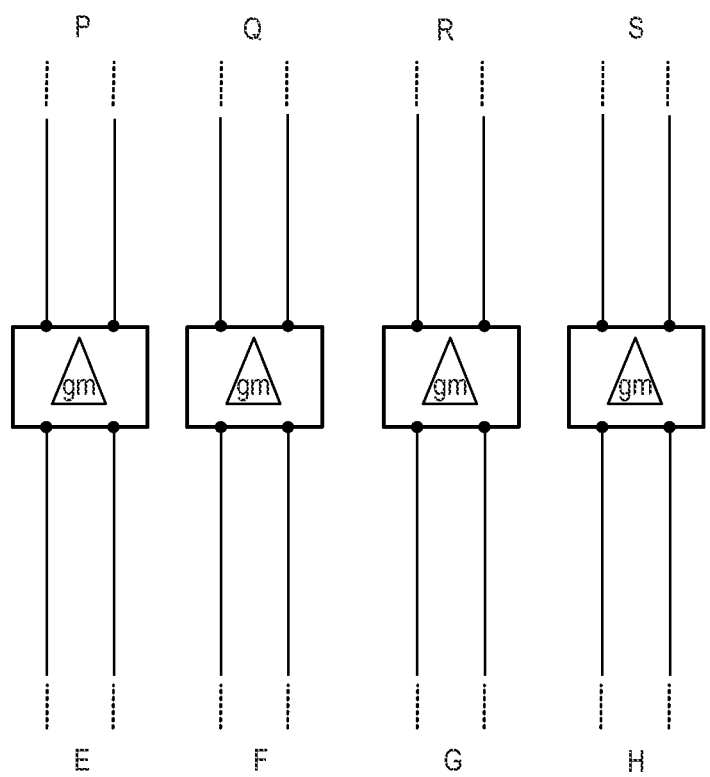
FIG. 6E is a circuit diagram of low band amplifiers in the traveling wave synthetic sampler of FIG. 6A, in accordance with a representative embodiment.
Figure 6F:
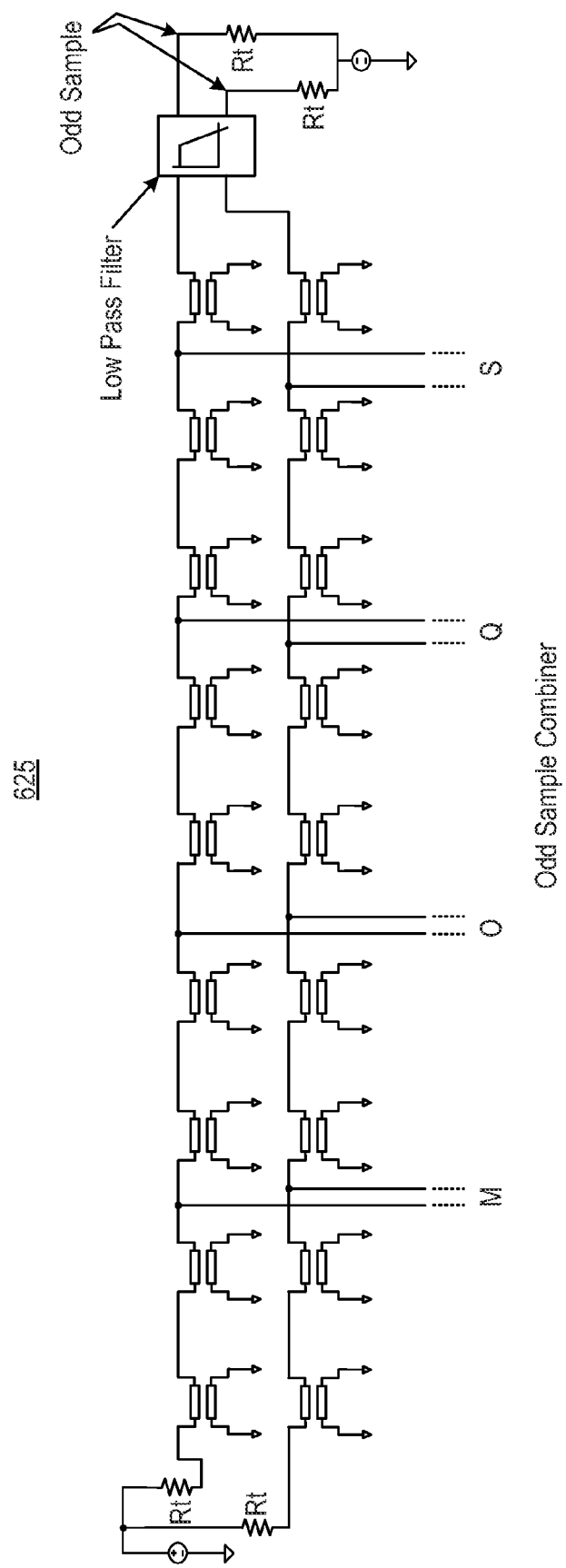
FIG. 6F is a circuit diagram of an odd sample combiner in the traveling wave synthetic sampler of FIG. 6A, in accordance with a representative embodiment.
Figure 6G:
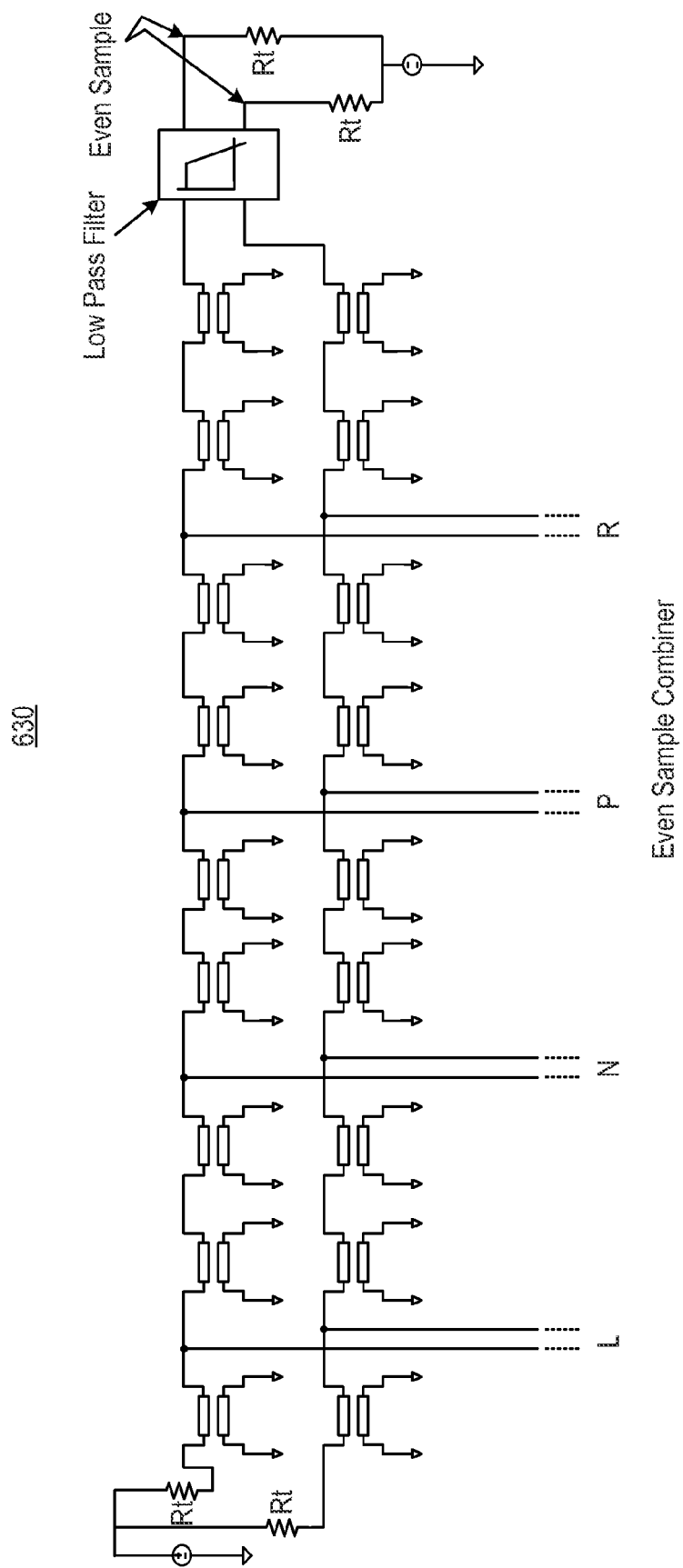
FIG. 6G is a circuit diagram of an even sample combiner in the traveling wave synthetic sampler of FIG. 6A, in accordance with a representative embodiment.

Referring to FIGS. 6A through 6G, traveling wave synthetic sampler 600 comprises an input transmission line 605, an LO signal generation unit 610, high band mixers 615, low band amplifiers 620, an odd sample combiner 625, and an even sample combiner 630. These features are generally arranged as shown in FIG. 6A, and more detailed examples of the features in FIG. 6A are shown in FIGS. 6B through 6G. In FIGS. 6B through 6G, dotted lines indicate that the illustrated signal lines are connected to signal lines in a different figure, and the letters "A" through "S" indicate correspondences between those different signal lines. As illustrated in FIGS. 6A through 6G, two output transmission lines and corresponding output filters are provided for the even and odd samples, rather than just one output transmission line. In addition, examples of differential signal lines and related components are shown in FIGS. 6B through 6G.

In the embodiments illustrated in FIGS. 5 and 6, both the low band and high band signals are sensed along a differential input line, then either mixed or amplified and combined onto two output differential pairs. These output pairs are then filtered to form the odd and even samples. As indicated above, the difference between even and odd samples is that is that the low band signal is subtracted from the high band signal to generate the odd sample, while the low band signal is added to the high band signal to generate the even sample. The odd and even samples produced in FIG. 6 contain all the necessary information to reproduce the RE input signal.

As indicated by the foregoing, in certain embodiments, a traveling wave mixer, sampler, or synthetic sampler can be implemented by incorporating transconductance amplifiers and mixers or samplers between a pair of transmission lines, and driving the mixers or samplers through an additional transmission line. Such devices provide various potential benefits relative to conventional technologies, such as improved bandwidth, gain, and noise characteristics, as well as reduced cost.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. An electronic device, comprising:
    an input transmission line configured to receive an input signal;
    an output transmission line configured to transmit an output signal produced according to the input signal, the output signal comprising a combination of a mixed high band signal and an amplified low band signal wherein the mixed high band signal is produced by the plurality of amplification and mixing stages, and the amplified low band signal is produced by the plurality of amplification stages;
    a local oscillator transmission line configured to transmit a local oscillator signal;
    a plurality of amplification and mixing stages arranged in parallel between the input and output transmission lines and each configured to amplify a received portion of the input signal and mix the amplified portion of the input signal with the local oscillator signal to produce a portion of the output signal; and
    a plurality of amplification stages arranged in parallel between the input and output transmission lines and each configured to amplify a received portion of the input signal to produce a portion of the output signal, wherein the plurality of amplification stages are located proximate an output side of the electronic device that transmits the output signal, and the plurality of amplification and mixing stages are located proximate an input side of the electronic device that receives the input signal.

2. The electronic device of claim 1, wherein each of the amplification and mixing stages comprises a transconductance amplifier arranged in series with a Gilbert mixer.

3. The electronic device of claim 2, wherein each of the amplification stages comprises a transconductance amplifier.

4. The electronic device of claim 1, further comprising:
    one or more first transmission line elements each disposed along the input transmission line between a corresponding pair of the amplification and mixing stages;
    one or more second transmission line elements each disposed along the output transmission line between a corresponding pair of the amplification and mixing stages; and one or more third transmission line elements each disposed along the local oscillator transmission line between a corresponding pair of the amplification and mixing stages.

5. The electronic device of claim 4, wherein each of the first through third transmission line elements comprises a circuit trace.

6. The electronic device of claim 4, further comprising one or more first transmission line elements each disposed along the input transmission line between a corresponding pair of the amplification stages; and
one or more second transmission line elements each disposed along the second transmission line between a corresponding pair of the amplification stages.

7. The electronic device of claim 1, wherein the electronic device performs synthetic sampling on the input signal to produce the output signal.

8. The electronic device of claim 1, wherein the input transmission line is connected between an input terminal and ground, and the second transmission line is connected between an output terminal and ground.

9. A communication system comprising the electronic device of claim 1.

10. A test instrument comprising the electronic device of claim 1.

11. An electronic device, comprising:
an input transmission line configured to receive an input signal;
an output transmission line configured to transmit an output signal produced according to the input signal;
a sample clock transmission line configured to transmit a sample clock signal; and
a plurality of amplification and sampling stages arranged in parallel between the input and output transmission lines and each configured to amplify a received portion of the input signal and sample the amplified portion of the input signal using the sample clock signal to produce a portion of the output signal; and
an additional output transmission line configured to transmit an additional output signal produced according to the input signal, wherein the output signal corresponds to even samples of the input signal and the additional output signal corresponds to odd samples of the input signal.

12. The electronic device of claim 11, wherein each of the amplification and sampling stages comprises a transconductance amplifier arranged in series with a sampler.

13. The electronic device of claim 12, wherein the sampler comprises first and second pairs of emitter-connected bipolar-junction transistors (BJTs), wherein the first pair of emitter-connected BJTs has collectors outputting an odd sample of the input signal, and the second pair of emitter-connected BJTs has collectors outputting an even sample of the input signal.

14. The electronic device of claim 11, wherein the plurality of amplification and sampling stages are configured to perform sampling at a rate of at least 100 GHz.

15. The electronic device of claim 11, wherein each of the amplification and sampling stages comprises a plurality of transistors formed on silicon germanium (SiGe) or indium phosphide (InP).

16. The electronic device of claim 11, wherein the respective portions of the output signal are summed in phase on the output transmission line to produce the output signal.

17. An electronic device, comprising:
an input transmission line configured to receive an input signal;
an output transmission line configured to transmit an output signal produced according to the input signal;
a local oscillator transmission line configured to transmit a local oscillator signal;
a plurality of amplification and mixing stages arranged in parallel between the input and output transmission lines and each configured to amplify a received portion of the input signal and mix the amplified portion of the input signal with the local oscillator signal to produce a portion of the output signal;
a plurality of amplification stages arranged in parallel between the input and output transmission lines and each configured to amplify a received portion of the input signal to produce a portion of the output signal, wherein the plurality of amplification stages are located proximate an output side of the electronic device that transmits the output signal, and the plurality of amplification and mixing stages are located proximate an input side of the electronic device that receives the input signal;
an additional output transmission line configured to transmit an additional output signal produced according to the input signal, wherein the output signal corresponds to even samples of a synthetic sampler and the additional output signal corresponds to odd samples of a synthetic sampler;
an additional plurality of amplification and mixing stages arranged in parallel between the input transmission line and the additional output transmission line and each configured to amplify a received portion of the input signal and mix the amplified portion of the input signal with the local oscillator signal to produce a portion of the additional output signal; and
an additional plurality of amplification stages arranged in parallel between the input transmission line and the additional output transmission line and each configured to amplify a received portion of the input signal to produce a portion of the additional output signal, wherein the additional plurality of amplification stages are located proximate the output side of the electronic device that transmits the output signal, and the additional plurality of amplification and mixing stages are located proximate the input side of the electronic device that receives the input signal.

18. The electronic device of claim 17, wherein each of the amplification and mixing stages comprises a transconductance amplifier arranged in series with a Gilbert mixer.

19. The electronic device of claim 18, wherein each of the amplification stages comprises a transconductance amplifier.

20. The electronic device of claim 17, wherein the output signal comprises a combination of a mixed high band signal and an amplified low band signal.

21. The electronic device of claim 20, wherein the mixed high band signal is produced by the plurality of amplification and mixing stages, and the amplified low band signal is produced by the plurality of amplification stages.

22. The electronic device of claim 17, further comprising:
one or more first transmission line elements each disposed along the input transmission line between a corresponding pair of the amplification and mixing stages;
one or more second transmission line elements each disposed along the output transmission line between a corresponding pair of the amplification and mixing stages; and one or more third transmission line elements each disposed along the local oscillator transmission line between a corresponding pair of the amplification and mixing stages.

23. The electronic device of claim 22, wherein each of the first through third transmission line elements comprises a circuit trace.

24. The electronic device of claim 22, further comprising one or more first transmission line elements each disposed along the input transmission line between a corresponding pair of the amplification stages; and
one or more second transmission line elements each disposed along the second transmission line between a corresponding pair of the amplification stages.

25. The electronic device of claim 17, wherein the electronic device performs synthetic sampling on the input signal to produce the output signal.

26. The electronic device of claim 17, wherein the input transmission line is connected between an input terminal and ground, and the second transmission line is connected between an output terminal and ground.

27. A communication system comprising the electronic device of claim claim 17.

28. A test instrument comprising the electronic device of claim 17.

* * * * *